United States Patent
Yen

(10) Patent No.: US 12,538,500 B2
(45) Date of Patent: Jan. 27, 2026

(54) INDUCTOR DEVICE

(71) Applicant: Realtek Semiconductor Corporation, Hsinchu (TW)

(72) Inventor: Hsiao-Tsung Yen, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 586 days.

(21) Appl. No.: 17/806,271

(22) Filed: Jun. 10, 2022

(65) Prior Publication Data

US 2023/0246061 A1    Aug. 3, 2023

(30) Foreign Application Priority Data

Jan. 28, 2022   (TW) ................... 111104069

(51) Int. Cl.
*H10D 1/20* (2025.01)
*H01F 27/34* (2006.01)
*H01F 27/36* (2006.01)
*H01L 23/522* (2006.01)

(52) U.S. Cl.
CPC ............... *H10D 1/20* (2025.01); *H01F 27/36* (2013.01); *H01L 23/5227* (2013.01); *H01F 2027/348* (2013.01)

(58) Field of Classification Search
None
See application file for complete search history.

(56) References Cited

U.S. PATENT DOCUMENTS

| | | | |
|---|---|---|---|
| 9,780,162 B2 | 10/2017 | Yen et al. | |
| 9,883,590 B2 | 1/2018 | Huang et al. | |
| 10,134,684 B2 | 11/2018 | Yen et al. | |
| 2011/0076979 A1* | 3/2011 | Wu | H01L 23/5225 336/84 R |
| 2020/0402698 A1* | 12/2020 | Tiemeijer | H10D 1/20 |
| 2021/0090988 A1 | 3/2021 | Yen et al. | |

FOREIGN PATENT DOCUMENTS

| | | |
|---|---|---|
| CN | 107771375 A | 3/2018 |
| TW | 201834177 A | 9/2018 |

* cited by examiner

*Primary Examiner* — Brent A. Fairbanks
*Assistant Examiner* — Derek L Nielsen
(74) *Attorney, Agent, or Firm* — CKC & Partners Co., LLC

(57) ABSTRACT

An inductor device includes a pattern ground shield (PGS) structure, a first trace, a second trace, and a first center-tapped element. The first trace is disposed above the pattern ground shield structure, and located in a first area. The second trace is disposed above the pattern ground shield structure, and located in a second area. The first area is adjacent to the second area. The first center-tapped element is disposed above the first trace or below the first trace, and passes through a first center point of the first area.

15 Claims, 5 Drawing Sheets

INDUCTOR DEVICE

RELATED APPLICATIONS

This application claims priority to and the benefit of Taiwan Application Serial Number 111104069, filed on Jan. 28, 2022, the entire contents of which are incorporated herein by reference as if fully set forth below in its entirety and for all applicable purposes.

BACKGROUND

Field of Invention

The present disclosure relates to an electronic device. More particularly, the present disclosure relates to an inductor device.

Description of Related Art

With development of the integrated circuit (IC) technology, electrical elements in an integrated circuit become smaller and smaller. However, when electrical elements in an integrated circuit become smaller and smaller, many negative impacts will occur. For example, a quality factor value (Q value) of an inductor is affected due to eddy currents generated by a substrate when the inductor operates.

If a patterned ground shield (PGS) structure is disposed in the inductor, it is useful to suppress the eddy current occurring in the inductor so as to improve the quality factor value. However, the design of the patterned ground shield structure still affects the quality factor value of the inductor.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

One aspect of the present disclosure is to provide an inductor device. The inductor device comprises a patterned ground shield structure, a first trace, a second trace, and a first center-tapped element. The first trace is disposed above the patterned ground shield structure, and located in a first area. The second trace is disposed above the patterned ground shield structure, and located in a second area, wherein the first area and the second area are adjacent to each other. The first center-tapped element is disposed above or below the first trace, and passes through a first center point of the first area.

Therefore, based on the technical content of the present disclosure, the first center-tapped element of the inductor device of the present disclosure is disposed in the first area, and the first center-tapped element passes through the first center point of the first area such that the structure of the inductor device is symmetrical. Therefore, the coupling between the first trace and the first center-tapped element are cancelled so as to improve the quality factor value (Q value) of the inductor device.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
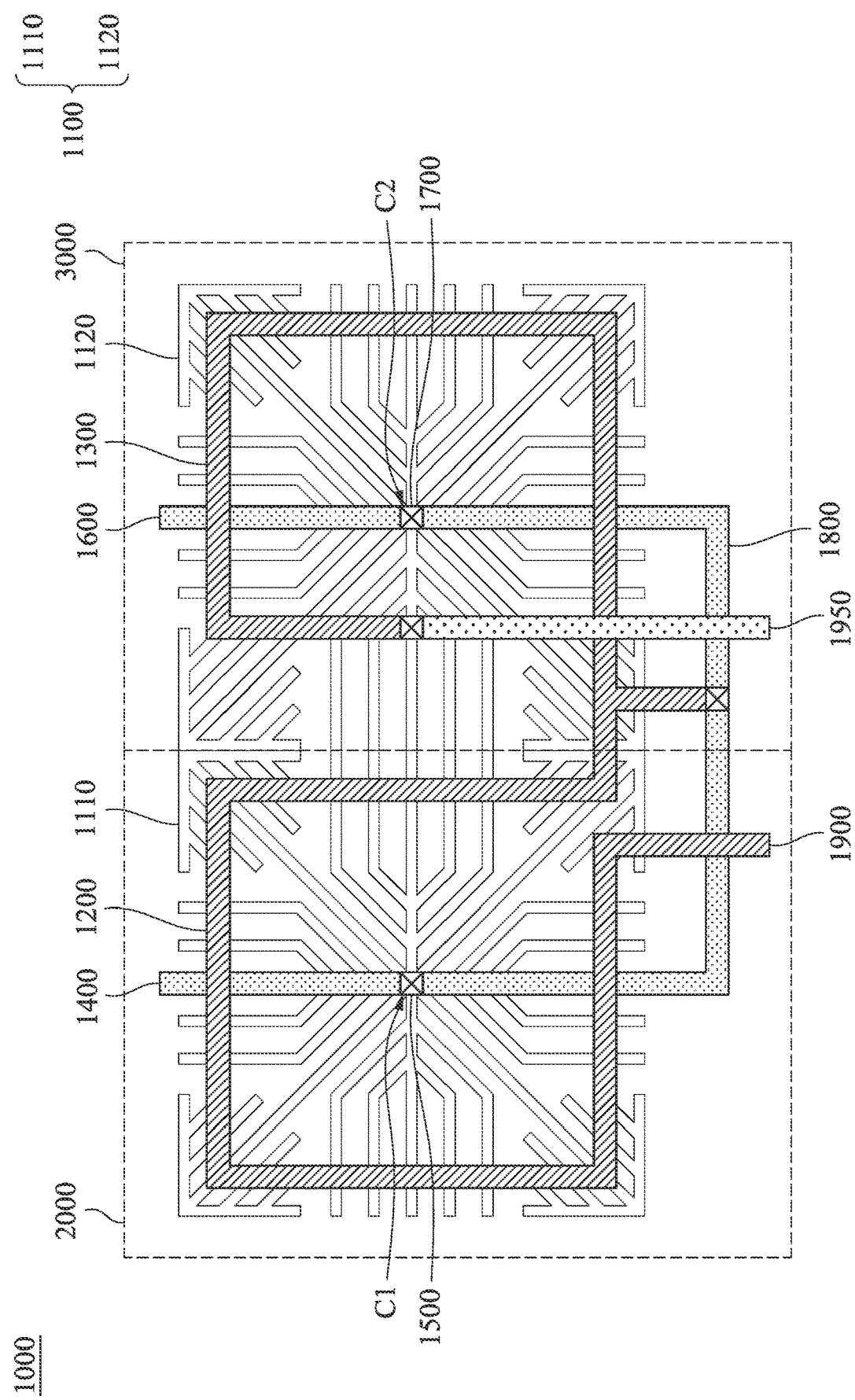
FIG. 1 depicts a schematic diagram of an inductor device according to one embodiment of the present disclosure.

FIG. 1 depicts a schematic diagram of an inductor device 1000 according to one embodiment of the present disclosure. As shown in the figure, the inductor device 1000 includes a patterned ground shield structure 1100, a first trace 1200, a second trace 1300, and a first center-tapped element 1400.

With respect to the structure, the first trace 1200 is disposed above the patterned ground shield structure 1100, and located in a first area 2000. The second trace 1300 is disposed above the patterned ground shield structure 1100, and located in a second area 3000. The first area 2000 and the second area 3000 are adjacent to each other. The first center-tapped element 1400 is disposed below the first trace 1200, and passes through a first center point C1 of the first area 2000.

As shown in FIG. 1, the patterned ground shield structure 1100 can be disposed on a first metal layer (M1), and the first center-tapped element 1400 can be disposed on one of a second metal layer (M2) to a six metal layer (M6). Therefore, the first center-tapped element 1400 and the patterned ground shield structure 1100 are located on different layers. Besides, the first trace 1200 can be disposed on a thick metal layer (Ultra Thick Metal, UTM), and the first center-tapped element 1400 and the first trace 1200 are located on different layers. In addition, the first area 2000 is directly adjacent to the second area 3000.

In one embodiment, the patterned ground shield structure 1100 includes a first pattern ground shield portion 1110. The first pattern ground shield portion 1110 is disposed above a substrate (not shown), and located in the first area 2000. In another embodiment, the inductor device 1000 further includes a first connection element 1500, and the first connection element 1500 is configured to couple to the first center-tapped element 1400 and the first pattern ground shield portion 1110. For example, the first connection element 1500 can be a via, and the via 1500 is used to couple the first center-tapped element 1400 and the first pattern ground shield portion 1110.

In another embodiment, the inductor device 1000 further includes a second center-tapped element 1600, and the second center-tapped element 1600 is disposed below the second trace 1300, and passes through a second center point C2 of the second area 3000.

As shown in FIG. 1, the patterned ground shield structure 1100 can be disposed on the first metal layer, and the second center-tapped element 1600 can be disposed on one of the second metal layer to the sixth metal layer. Therefore, the second center-tapped element 1600 and the patterned ground shield structure 1100 are located on different layers. Besides, the second trace 1300 can be disposed on the thick metal layer, and the second center-tapped element 1600 and the second trace 1300 are located on different layers.

In one embodiment, the patterned ground shield structure 1100 further includes a second pattern ground shield portion 1120, and the second pattern ground shield portion 1120 is disposed above a substrate (not shown), and located in the second area 3000. In another embodiment, the inductor device 1000 further includes a second connection element 1700, and the second connection element 1700 is configured to couple the second center-tapped element 1600 and the second pattern ground shield portion 1120. For example, the second connection element 1700 can be a via, and the via 1700 is used to couple the second center-tapped element 1600 and the second pattern ground shield portion 1120.

In another embodiment, the inductor device 1000 further includes a third connection element 1800, and the third connection element 1800 is coupled to the second trace 1300. The third connection element 1800 is coupled to the first center-tapped element 1400 and the second center-tapped element 1600. However, the present disclosure is not intended to be limited to this embodiment. In other embodiments, the third connection element 1800 can be coupled to the first trace 1200 depending on accrual requirements.

In one embodiment, the inductor device 1000 further includes a first input/output element 1900. The first input/output element 1900 is coupled to the first trace 1200, and located in the first area 2000. In another embodiment, the first input/output element 1900 and the first trace 1200 are located on the same layer. In an optional embodiment, the first input/output element 1900 is across the third connection element 1800.

In another embodiment, the inductor device 1000 further includes a second input/output element 1950. The second input/output element 1950 is coupled to the second trace 1300, and located in the second area 3000. In one embodiment, the second input/output element 1950 and the second trace 1300 are located on different layers, and they can be coupled to each other by a via. In an optional embodiment, the second input/output element 1950 is across the second trace 1300 and the third connection element 1800.

As shown in FIG. 1, the patterned ground shield structure 1100 can be disposed on the first metal layer. The first center-tapped element 1400 and the second center-tapped element 1600 can be disposed on one of the second metal layer to the sixth metal layer. The first trace 1200 and the second trace 1300 can be disposed on the thick metal layer, and the third connection element 1800 can be disposed on a redistribution layer (RDL). In addition, the first trace 1200 and the second trace 1300 can form a twin inductor together. However, the present disclosure is not limited to the structure as shown in FIG. 1, and it is merely an example for illustrating one of the implements of the present disclosure.

Figure 2:
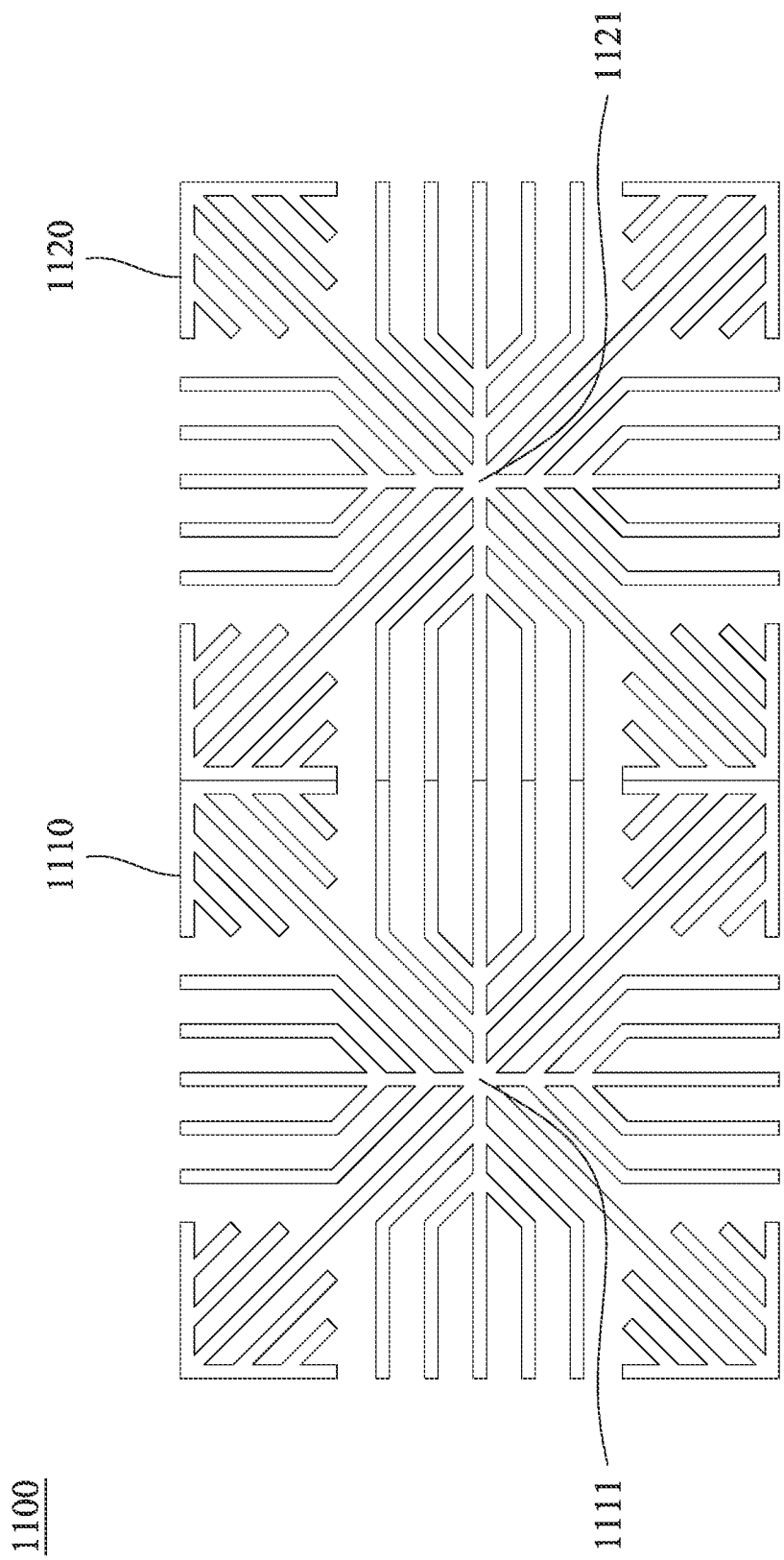
FIG. 2 depicts a schematic diagram of a patterned ground shield structure of the inductor device shown in FIG. 1 according to one embodiment of the present disclosure.

FIG. 2 depicts a schematic diagram of a patterned ground shield structure 1100 of the inductor device 1000 shown in FIG. 1 according to one embodiment of the present disclosure. In one embodiment, one terminal of the first connection element 1500 in FIG. 1 is coupled to the first center-tapped element 1400, and another terminal of the first connection element 1500 is coupled to the first center terminal 1111 of the first pattern ground shield portion 1110 in FIG. 2. In another embodiment, one terminal of the second connection element 1700 in FIG. 1 is coupled to the second center-tapped element 1600, and another terminal of the second connection element 1700 is coupled to the second center terminal 1121 of the second pattern ground shield portion 1120 in FIG. 2. However, the present disclosure is not limited to the structure as shown in FIG. 2, and it is merely an example for illustrating one of the implements of the present disclosure.

Figure 3:
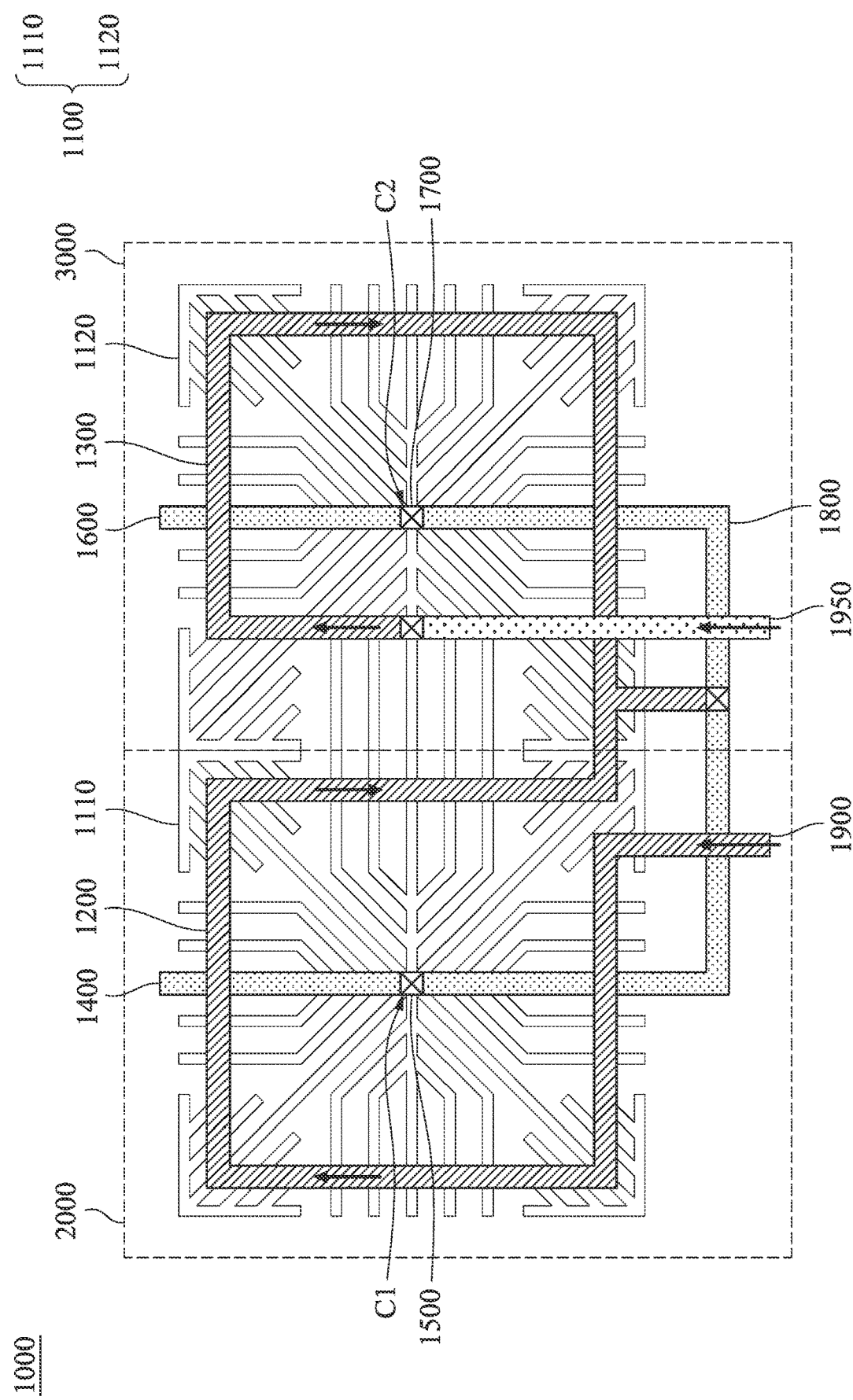
FIG. 3 depicts an operation diagram of the inductor device shown in FIG. 1 according to one embodiment of the present disclosure.

FIG. 3 depicts an operation diagram of the inductor device 1000 shown in FIG. 1 according to one embodiment of the present disclosure. As shown in the figure, when the inductor device 1000 operates in a common mode, the current flows into the first input/output element 1900 and the second input/output element 1950, and currents marked by arrows occur in the first trace 1200 and the second trace 1300. Since directions of the currents at two sides of the first trace 1200 are opposite, the coupling between the first trace 1200 and the first center-tapped element 1400 are cancelled. Similarly, the coupling between the second trace 1300 and the second center-tapped element 1600 are cancelled. However, the present disclosure is not limited to the structure as shown in FIG. 3, and it is merely an example for illustrating one of the implements of the present disclosure.

Figure 4:
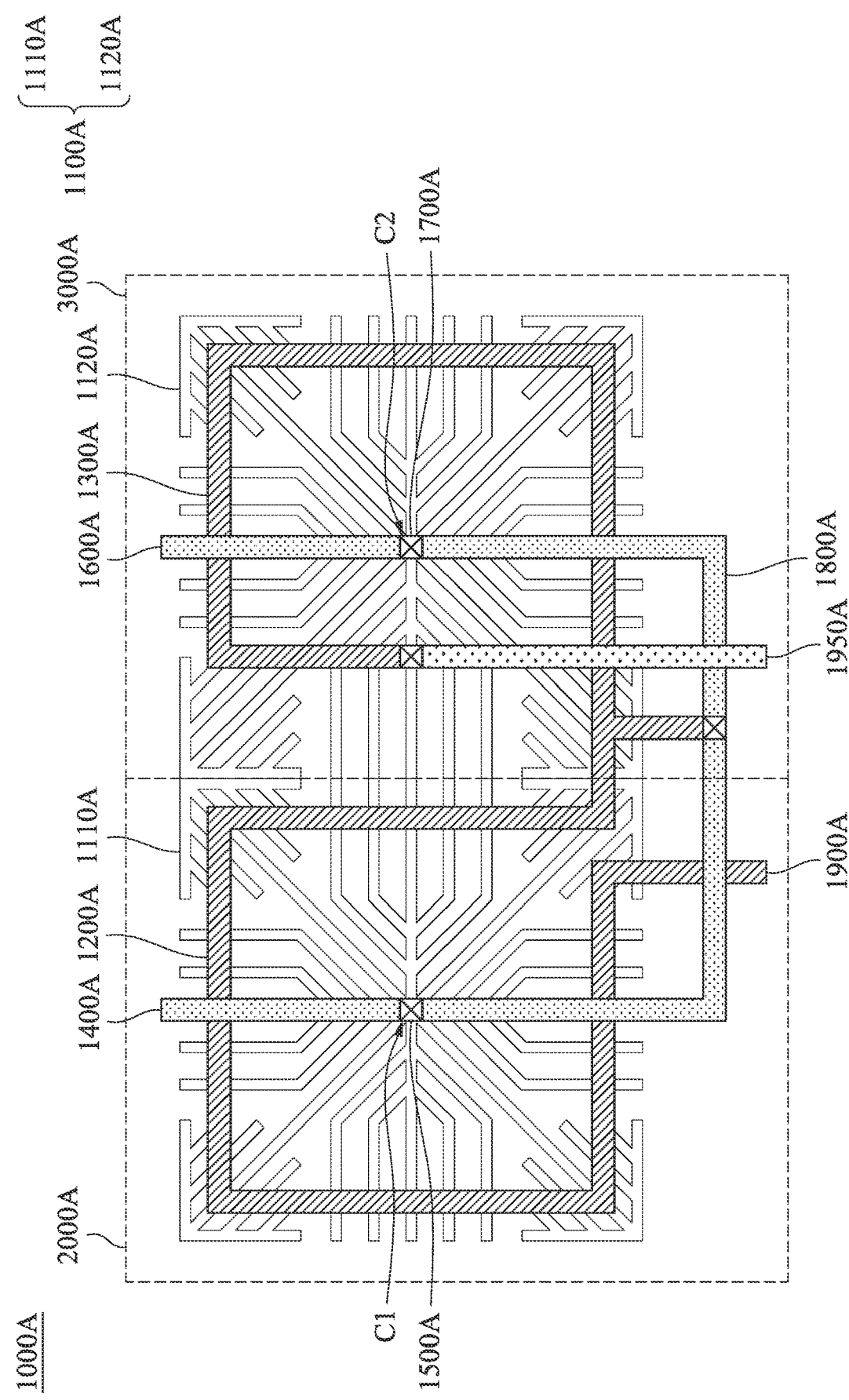
FIG. 4 depicts a schematic diagram of an inductor device according to one embodiment of the present disclosure.

FIG. 4 depicts a schematic diagram of an inductor device 1000A according to one embodiment of the present disclosure. It is noted that, compared with the inductor device 1000 in FIG. 1, the first center-tapped element 1400A and the second center-tapped element 1600A of the inductor device 1000A in FIG. 4 are disposed above the first trace 1200A and the second trace 1300A. It is noted that, the element in FIG. 4, whose symbol is similar to the symbol of the element in FIG. 1, has similar structure feature in connection with the element in FIG. 1. Therefore, a detail description regarding the structure feature of the element in FIG. 4 is omitted herein for the sake of brevity. Besides, the present disclosure is not limited to the structure as shown in FIG. 4, and it is merely an example for illustrating one of the implements of the present disclosure.

Figure 5:
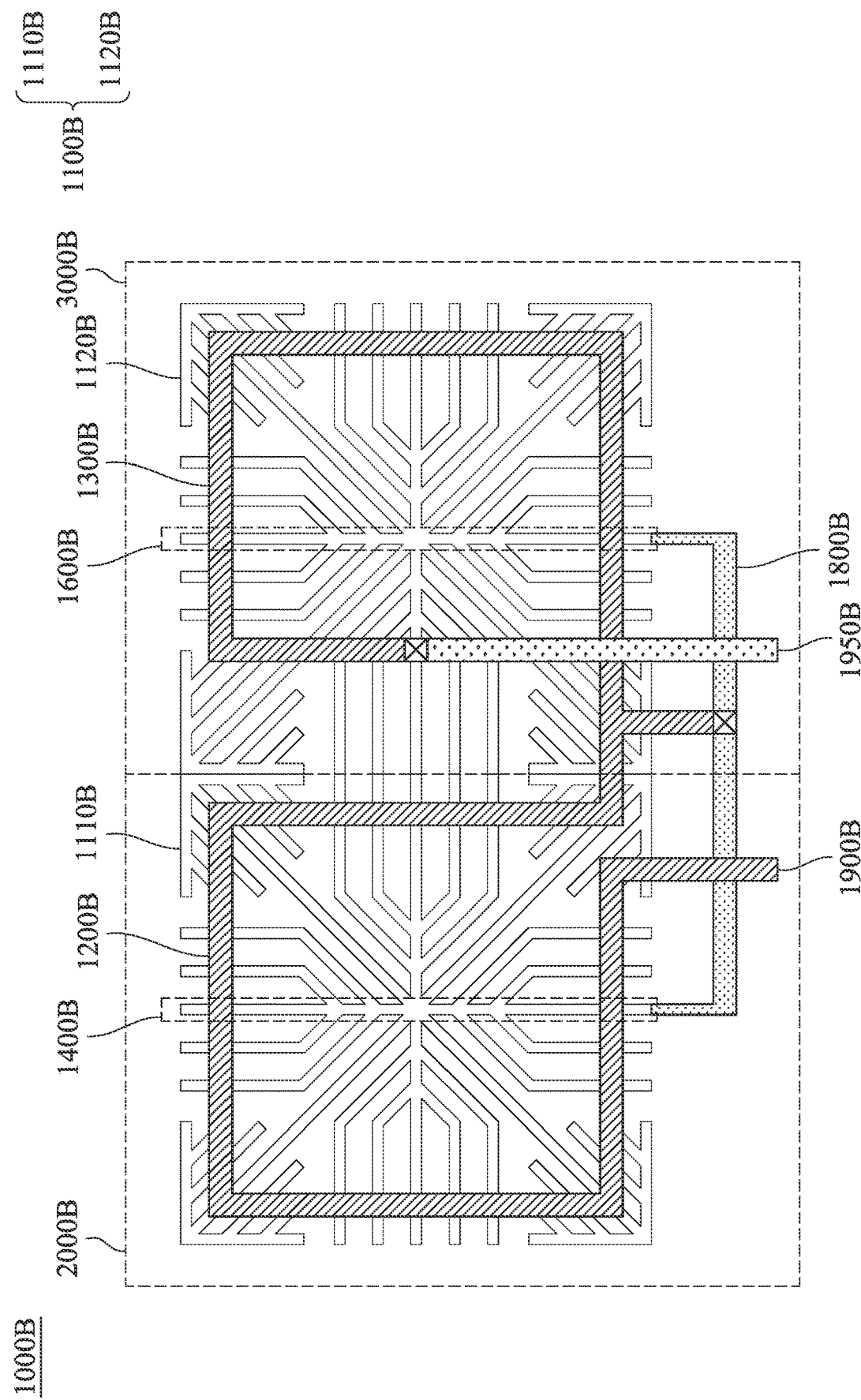
FIG. 5 depicts a schematic diagram of an inductor device according to one embodiment of the present disclosure.

FIG. 5 depicts a schematic diagram of an inductor device 1000B according to one embodiment of the present disclosure. It is noted that, compared with the inductor device 1000 in FIG. 1, the different in the inductor device 1000B in FIG. 5 is that the first center-tapped element 1400B and the patterned ground shield structure 1100B can be disposed on the same layer, and the second center-tapped element 1600B and the patterned ground shield structure 1100B can be disposed on the same layer. Besides, the inductor device 1000B can use a center bone of the first pattern ground shield portion 1110B to be the first center-tapped element 1400B. In addition, the inductor device 1000B can use a center bone of the second pattern ground shield portion 1120B to be the second center-tapped element 1600B. It is noted that, the element in FIG. 5, whose symbol is similar to the symbol of the element in FIG. 1, has similar structure feature in connection with the element in FIG. 1. Therefore, a detail description regarding the structure feature of the element in FIG. 5 is omitted herein for the sake of brevity. Besides, the present disclosure is not limited to the structure as shown in FIG. 5, and it is merely an example for illustrating one of the implements of the present disclosure.

It can be understood from the embodiments of the present disclosure that application of the present disclosure has the following advantages. The first center-tapped element and the second center-tapped element of the inductor device of the present disclosure are disposed in the first area and the second area respectively, and the first center-tapped element and the second center-tapped element passes through the center point of the first area and the center point of the second area respectively such that the structure of the inductor device is symmetrical. Therefore, the coupling between the first trace and the first center-tapped element are cancelled, and the coupling between the second trace and the second center-tapped element are cancelled so as to improve the quality factor value of the inductor device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor device, comprising:
a patterned ground shield structure, comprising:
a first pattern ground shield portion, disposed above a substrate, and located in a first area;
a first trace, disposed above the patterned ground shield structure, and located in the first area;
a second trace, disposed above the patterned ground shield structure, and located in a second area, wherein the first area and the second area are adjacent to each other;
a first center-tapped element, disposed above or below the first trace, and passing through a first center point of the first area;
a first connection element, configured to couple to the first center-tapped element and the first pattern ground shield portion; and
a second center-tapped element, disposed above or below the second trace, and passing through a second center point of the second area,
wherein a first segment of the first trace and a second segment of the second trace are between the first center-tapped element and the second center-tapped element,
wherein the first segment of the first trace, the second segment of the second trace, the first center-tapped element, and the second center-tapped element extend along a same direction.

2. The inductor device of claim 1, wherein the first center-tapped element and the patterned ground shield structure are located on different layers.

3. The inductor device of claim 1, wherein the first connection element is coupled to the first center-tapped element and a first center terminal of the first pattern ground shield portion.

4. The inductor device of claim 1, wherein the second center-tapped element and the patterned ground shield structure are located on different layers.

5. The inductor device of claim 1, wherein the patterned ground shield structure further comprises:
a second pattern ground shield portion, disposed above the substrate, and located in the second area.

6. The inductor device of claim 5, further comprising:
a second connection element, configured to couple to the second center-tapped element and the second pattern ground shield portion.

7. The inductor device of claim 6, wherein the second connection element is coupled to the second center-tapped element and a second center terminal of the second pattern ground shield portion.

8. The inductor device of claim 7, further comprising:
a third connection element, coupled to the second trace, and configured to couple to the first center-tapped element and the second center-tapped element.

9. The inductor device of claim 8, further comprising:
a first input/output element, coupled to the first trace, and located in the first area.

10. The inductor device of claim 9, wherein the first input/output element and the first trace are located on a same layer.

11. The inductor device of claim 10, wherein the first input/output element is across the third connection element.

12. The inductor device of claim 11, further comprising:
a second input/output element, coupled to the second trace, and located in the second area.

13. The inductor device of claim 12, wherein the second input/output element is across the second trace and the third connection element.

14. The inductor device of claim 12, wherein the second input/output element is across the third connection element.

15. The inductor device of claim 12, wherein the second input/output element and the second trace are located on different layers.

* * * * *